United States Patent [19]

Ashida et al.

[11] Patent Number: 4,974,042
[45] Date of Patent: Nov. 27, 1990

[54] SEMICONDUCTOR MEMORY DEVICE WITH COMPACT ROM MEMORY CELLS

[75] Inventors: Tsutomu Ashida, Yamatokoriyama; Mikiro Okada, Nara, both of Japan

[73] Assignee: Sharp Kabushiki Kaisha, Osaka, Japan

[21] Appl. No.: 226,315

[22] Filed: Jul. 27, 1988

[30] Foreign Application Priority Data

Jul. 27, 1987 [JP] Japan .................................. 62-188148

[51] Int. Cl.⁵ ..................... H01L 29/78; H01L 27/02; H01L 27/10; G11C 17/00
[52] U.S. Cl. .................................. 357/23.12; 357/41; 357/45; 365/104
[58] Field of Search ..................... 357/23.9, 23.12, 41, 357/45; 365/104

[56] References Cited

U.S. PATENT DOCUMENTS

| | | | |
|---|---|---|---|
| 4,268,950 | 5/1981 | Chatterjee et al. | 357/23.12 |
| 4,328,563 | 5/1982 | Schroeder | 357/23.12 |
| 4,342,100 | 7/1982 | Kuo | 357/23.12 |
| 4,356,042 | 10/1982 | Gedaly et al. | 357/23.12 |
| 4,364,167 | 12/1982 | Donley | 357/23.12 |
| 4,390,971 | 6/1983 | Kuo | 365/104 |
| 4,805,143 | 2/1989 | Matsumoto et al. | 365/104 |

Primary Examiner—Gene M. Munson

[57] ABSTRACT

A matrix type semiconductor memory device with a higher complexity is provided which includes a p-type (or an n-type) semiconductor substrate, a plurality of n-type (or p-type) semiconductor regions formed as strips that are arranged in parallel at predetermined spacings in the surface of the substrate, the semiconductor regions provide alternating source regions and drain regions which define gate regions between the alternating regions, a first gate insulating film formed in a plurality of strips on the surface of the substrate at predetermined spacings which intersect the plurality of semiconductor regions, a plurality of first gate electrodes formed on each of the strips of the first gate insulating film, a second gate insulating film formed in a plurality of portions on the exposed surfaces of the substrate between the strips of first gate insulating film, and a plurality of second gate electrodes formed on each of the portions of the second gate insulating film without contacting the first gate electrodes. Thereby, a matrix of MIS semiconductor cells is formed, with each of the cells being provided at the intersection of each of the gate regions with one of the first and second electrodes, and the gate regions of some of the cells are selectively doped with a p-type (or an n-type) impurity substance at a higher concentration than the substrate.

13 Claims, 2 Drawing Sheets

FIG. 1(a)
FIG. 1(c)
FIG. 1(b)
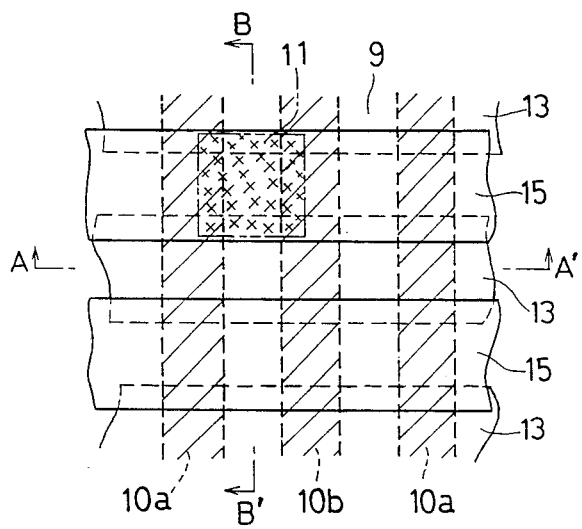
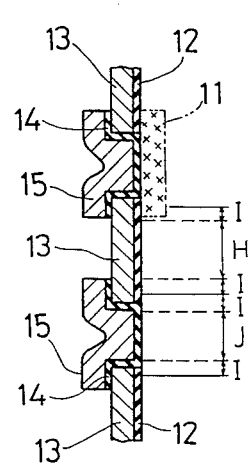
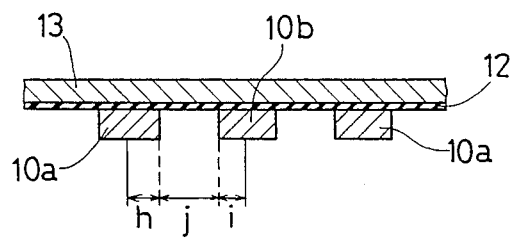

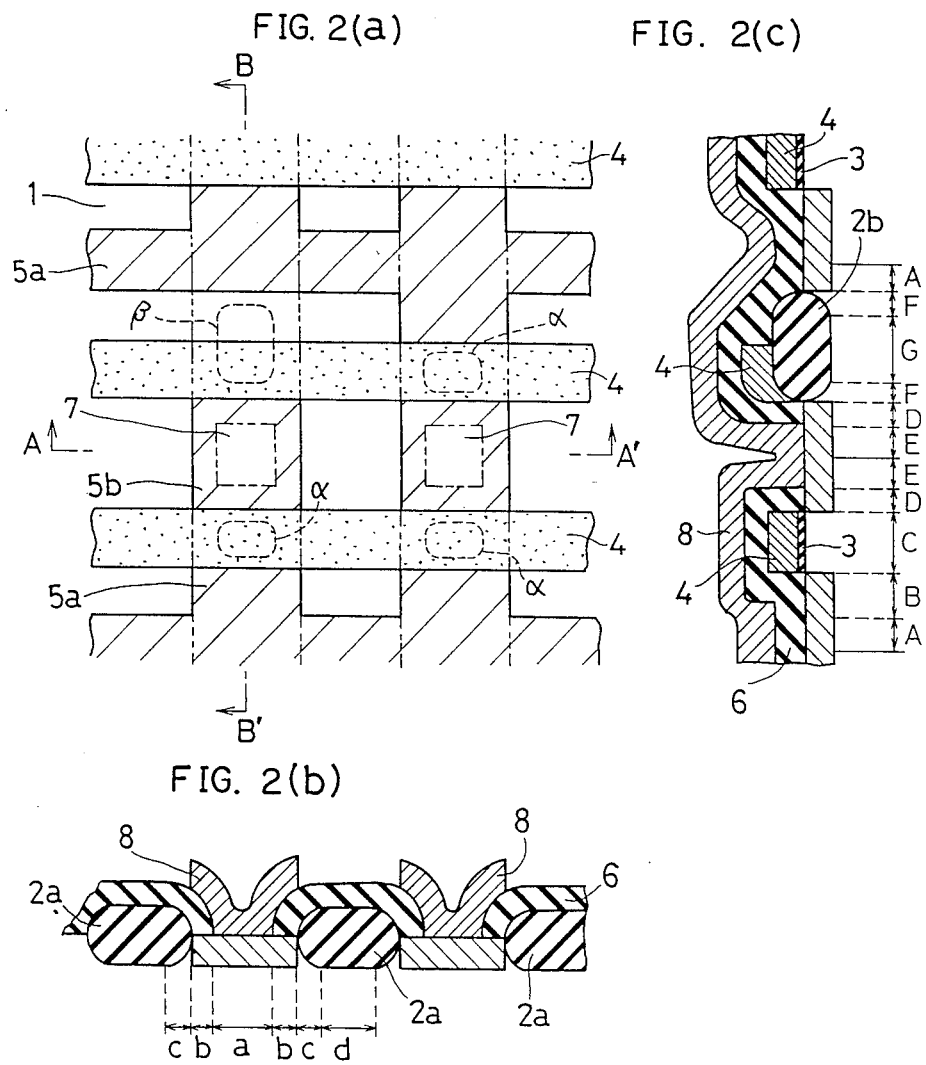

SEMICONDUCTOR MEMORY DEVICE WITH COMPACT ROM MEMORY CELLS

BACKGROUND OF THE INVENTION

1. Field of the Invention

The present invention relates to semiconductor memory devices, and more particularly to read-only memories (hereinafter referred to as "ROMs").

2. Description of the Related Art

ROMs for use in storing various items of program data generally include a plurality of MIS transistors in the form of a matrix of gate wiring source regions and drain regions.

Such ROMs are in predetermined to be broken in the source-drain circuit of the transistors, or short-circuited between the source and drain regions, or inactivated between the source and drain regions with an increased thickness of the insulating film under the gate wiring (i.e., gate insulating film). Whereby currents between the drain and the source are detected or non-detected and hence the memory data unit is stored as a "1" or a "0".

The so-called LOCOS (Local Oxidation Silicon) process (Electronics, Dec. 20, p. 45, (1971)); "MOS Device," Complete Book of Electronics Techniques, pp. 290–291, Kogyo Chosakai (Industrial Research Association, (1976)) is used for forming thick insulating films for use in ROMs.

FIG. 2 (a) is a plan view of a conventional silicon-gate ROM, FIG. 2 (b) is a view for the section taken along the line A–A' in FIG. 2 (a), and FIG. 2 (c) is a view for the section taken along the line B–B' in FIG. 2 (a). Oxide films 2a and 2b are formed by the LOCOS process on the cell separating regions and inactive transistor gate regions of a semiconductor substrate 1, and a gate oxide film 3 is formed on the gate regions thereof to provide active transistors. Polysilicon gate wiring 4 is then formed on the substrate 1, and semiconductor regions, which provide source regions 5a and drain regions 5b, are thereafter formed on the substrate 1 by using the oxide films 2a and 2b and the gate wiring 4 for masking. Subsequently, an interlayer insulating film 6 of NSG, BPSG or the like is formed on the substrate 1, contact holes 7 are formed in the interlayer insulating film 6 on the drain regions 5b, and metal wiring 8 is thereafter provided in contact with the drain regions 5b.

Thus, the oxide film 2b having a larger thickness than the gate film 3 is formed in the gate regions ($\beta$) of the inactive transistors by the LOCOS process, so that when such a transistor is selected for reading out data, no current flows between the source region 5a and the drain region 5b. This corresponds, for example, to the memory data unit "0". Accordingly various items of data can be stored using the combination of this unit with the memory data unit. For example, a "1" may be stored at the gate region ($\alpha$) of the active transistor.

However, when thick insulating films are formed by the LOCOS process, the film formed invariably has a larger width than is intended because of the influence from the internal diffusion of oxygen during thermal oxidation. An increase in the ratio of the width is greater when the specified width is smaller.

Because the ROM cells have such a thick insulating film in the cell separating region and the gate inactivating film are limited in design by the increase in the film width, limitations are imposed on the provision of ROMs having a greater complexity.

This will be described more specifically with reference to the conventional ROM described which must have pitches, according to the 1.0-$\mu$m rule, for example as illustrated in FIG. 2 (b), the horizontal pitch required is 3.6 $\mu$m, which is a total of 1 $\mu$m for a space a of the contact hole 7, 0.4 $\mu$m for each of two portions of allowance b for the alignment of the contact hole 7 with the drain region 5b, 0.4 $\mu$m for each of two edge portions c of the oxide film 2a formed by the LOCOS process and provide a cell separating region, and 1 $\mu$m for a space d of the oxide film 2a formed by the LOCOS process to provide a cell separating region.

With reference to FIG. 2 (c), the vertical pitch for the active transistor is 3.2 $\mu$m, which is a total of 0.5 $\mu$m for a half portion A of the source region 5a, 0.8 $\mu$m for an allowance B for the aligment of the gate 4 with the source area 5a, 1 $\mu$m for the width C of the gate 4, 0.4 $\mu$m for an allowance D for aligning the gate 4 with the contact hole 7, and 0.5 $\mu$m for one half portion E of the contact hole 7. With the inactive transistor, the vertical pitch is 3.2 $\mu$m, which is a total of 0.5 $\mu$m for the other half portion E of the contact hole 7, 0.4 $\mu$m for an allowance D for aligning the gate wiring 4 with the contact hole 7, 0.4 $\mu$m for each of two edge portions F of the oxide film 2b formed by the LOCOS process in the gate region of the inactive transistor, 1 $\mu$m for a space G of the oxide film 2b, and 0.5 $\mu$m for a half portion A of the source region 5a. The pitch required is 3.2 $\mu$m regardless of whether the transistor is active or inactive.

There is a need to provide spaces which are not directly relevant to the separation of cells or to the inactivation of transistors, i.e. the edge portions c of the oxide film 2a and the edge portions F of the oxide film 2b. Consequently, each cell requires a large space (in the above case, 3.6 $\mu$m $\times$ 3.2 $\mu$m = 11.52 $\mu$m$^2$) which is objectionable in providing compact ROMs of higher complexity.

SUMMARY OF THE INVENTION

The main object of the present invention, which has been accomplished to overcome the above described problems is to provide a semiconductor memory device which is less complex than conventional devices.

A semiconductor memory device is provided comprising:

(a) a p-type (or an n-type) semiconductor substrate, (b) a group plurality of n-type (or p-type) semiconductor regions formed in the surface layer of the substrate in the form of strips arranged in parallel at predetermined spacings, the semiconductor regions provide alternating source regions and drain regions which define gate regions between the alternating source and drain regions, (c) a plurality of strips of a first gate insulating film formed on the surface of the substrate at predetermined spacings and intersecting the plurality of semiconductor regions, (d) a plurality of first gate electrodes formed on each of the strips of the first gate insulating film, (e) a group plurality of portions of a second gate insulating film formed on the exposed surface of the substrate between the strips of the first gate insulating film, and (f) a plurality of second gate electrode formed on each of the portions of second gate insulating film without the contacting any of the first gate electrodes, whereby a matrix of MIS semiconductor cells is formed, each of the cells being defined by the intersection of each of the gate regions with one of the first and second electrodes, and some of the gate regions of the cells being selectively doped with a p-type (or n-type) impurity substance at a higher concentration than the substrate.

A process for producing a semiconductor memory device is further provided comprising the steps of:

(a) forming a plurality of n-type (or p-type) semiconductor regions in a plurality of parallel strips in the surface layer of a p-type (or n-type) semiconductor substrate, the semiconductor regions providing alternated source regions and drain regions with defining gate regions being defined therebetween, (b) forming an insulating film over the surface of the semiconductor substrate, (c) forming a plurality of first gate electrodes on the insulating film in the form of parallel strips intersecting the semiconductor regions, (d) removing the insulating film from the substrate surface portions between the first gate electrodes utilizing the electrodes as a mask to form strips of a first gate insulting film, (e) forming a second gate insulating film on the substrate surface portions, and (f) forming a plurality of second gate electrodes on each portion of the second gate insulating film, the gate regions of cells being defined by the intersections of the gate regions with one of the first and second electrodes being selectively doped by an ion implantation of a p-type (or n-type) impurity substance having a higher concentration than the substrate at the stage after any of the steps (a)-(f).

The present invention has been accomplished by directing attention to the following chacteristics. When selected gate regions are doped with impurities having a higher concentration than the substrate, the transistors may be inactivated without forming a thick insulating film. When two groups of wirings are closely and alternately arranged, the non-selected gate electrodes are given a potential which renders the transistors under the non-selected gate electrodes non-conductive. Thereby the semiconductor surface regions under the non-selected gate electrodes adjacent to the selected gate electrodes can be made to function similar to cell separating regions.

This makes it possible to provide a ROM being exceedingly greater in complexity, i.e. having a greater memory capacity, than the conventional devices.

The cells (transistor) having gate regions doped with impurities at a high concentration have a higher threshold gate voltage than the cells having gate regions not doped to the high concentration As a result, the the following difference occurs. With a reference voltage, which is lower than the threshold voltage A of the latter transistor, applied to the electrodes of these two transistors, a voltage (selection voltage) higher than the threshold voltage A but lower than the threshold voltage B of the former transistor is applied to one of the electrodes. The transistor not having the high dopant concentration is then brought into conduction, whereas the highly doped transistor remains non-conductive. The former state corresponds to the memory data unit being a "1" for example and the latter to the memory data unit being a "0", for example.

The devices in the embodiments of the present invention do require the conventional cell separating region, and the required area per transistor is thereby greatly reduced. This makes it possible to integrate transistors with greater complexity while providing compact ROM memory cells.

BRIEF DESCRIPTION OF THE DRAWINGS

The present invention will become more fully understood from the detailed description given hereinbelow and the accompanying drawings which are given by way of illustration only, and thus, are not limitative of the present invention, and wherein:

FIG. 1 (a) is a plan view illustrating an embodiment of the present invention;

FIG. 1 (b) is a view in section taken along the line A-A' in FIG. 1 (a);

FIG. 1 (c) is a view in section taken along the line B-B' in FIG. 1 (a);

FIG. 2 (a) is a plan view of a conventional device;

FIG. 2 (b) is a view in section taken along the line A-A' in FIG. 2 (a); and

FIG. 2 (c) is a view in section taken along the line B-B' in FIG. 2 (a).

DESCRIPTION OF THE PREFERRED EMBODIMENTS

The first and second gate insulating films according to an embodiment of the present invention are conventional gate insulating films such as $SiO_2$, $Si_3N_4$ or the like. The thickness of these films is preferred to be between 100 angstroms and 1000 angstroms because the insulating property and the application of an electric field. The films can be formed by usual conventional thermal oxidation methods, CVD methods, etc. The second gate insulating film is as formed as to cover each edge portion of the gate electrodes which are formed in strips having a specified width on each strip of first gate insulating film. This structure inhibits and diminishes the leakage current between the cells.

The first and second gate electrodes of the device in the present embodiment are each formed as strips on the first and second gate insulating films, respectively. Examples of suitable materials for forming these electrodes are polycrystalline silicon, metals, such as W, Ti, Pt and Mo which have high melting points, Al and other similar metals and silicides, such as WSi, WSi and WTiSi.

The semiconductor substrate in the present embodiment may be made of various conventional materials used in the art, where Si substrates are most commonly used. The conductivity of the group of semiconductor regions is opposite to the conductivity of the substrate. Each group of insulating film strips, and each group of gate electrodes can be formed by conventional methods, such as lithography. The number of lines thereof is determined in accordance with the desired memory capacity.

The impurity substance for doping the selected gate regions at a high concentration has the same conductivity type as the substrate. The high concentration should be about $10^2$ to $10^5$ times greater than the impurity concentration of the substrate. The high-concentration doping is conventionally accomplished by ion implantation.

The semiconductor memory device of the present embodiment may have attached thereto a portion or a circuit, such as external wiring or external insulating film formed with contact holes for the gate electrodes.

EXAMPLE

With reference to the drawings, an example for an embodiment of the present invention will be described below, but the present invention is not limited to this example.

FIG. 1 (a) is a plan view illustrating an embodiment of the present invention, FIG. 1 (b) is a view in section taken along the line A-A' in FIG. 1 (a), and FIG. 1 (c) is a view in section taken along the line B-B' in FIG. 1 (a).

The components of the present embodiment will be described step by step according to the production process thereof.

Impurity regions 10 are first formed in the main surface of a semiconductor substrate 9 having a first conductivity type in order to provide source regions 10a and drain regions 10b. The semiconductor substrate used for the present embodiment is a p-type silicon single-crystal substrate including $7 \times 10^{14}$ ats./cm$^3$ of p-type impurities (boron). The impurity regions 10 having a second conductivity type are formed in the surface layer of the substrate 9 in an approximately parallel relation by the ion implantation of n-type impurities (phosphorus at a concentration of $1 \times 10^{20}$ ats./cm$^3$)

Impurity regions 11 having the first conductivity type are selectively and locally formed in the spaces (gate regions) between the source regions 10a and the drain regions 10b of the substrate 9 in square patterns A first gate oxide film 12 is then formed substantially over the entire surface of the resulting substrate 9. The impurity (high-concentration) regions 11 are formed by an ion implantation of boron at about $10^3$ times ($7 \times 10^{17}$ ats./cm$^3$) the concentration of the substrate. The gate oxide film 12 is formed by thermal oxidation in dry O$_2$ gas and is about 200 angstroms in thickness. The impurity regions 11 of the first conductivity type are formed by ion implantation after forming the second gate wiring.

Pieces of a first polysilicon gate wiring 13 are subsequently formed by the CVD process on the first gate oxide film 12 over the substrate 9, in an approximately parallel relation to intersect the impurity regions 10 of the second conductivity type.

The first gate oxide film 12 is then etched away from the portions of the substrate 9, which are left uncovered by the first gate wiring 13, to expose the substrate portions. A second gate oxide film 14, about 200 angstroms in thickness, is thereafter formed by thermal oxidation over the entire surface of the substrate 9. The second gate oxide film 14 covers not only the exposed surface portions of the substrate 9 but also the edge portions of the first gate wiring 13 as illustrated. Next, a second polysilicon gate wiring 15 is formed by the CVD process between the pieces of the first gate wiring 13. The second gate wiring 15 is provided not only between the wiring portions 13 but also over the opposed side faces of the wiring 13. The second gate oxide film 14 left uncovered by the second gate wiring 15 is subsequently etched away. An interlayer insulating film, contact holes and metal wiring are thereafter formed by conventional CVD processes, photoetching processes and PVD processes on the substrate 9, which is covered with the first gate wiring 13 and the second gate wiring 15, to obtain a masked ROM having doublelayer polysilicon gates.

Although the second gate wiring 15 of the present embodiment extends over the side faces of the first gate wiring 13, the wiring 15 can be formed without being extended.

With this ROM, the transistor, which includes the impurity region 11 having the first conductivity type doped with impurities of the same conductivity type as the impurities in the semiconductor substrate 9 as the channel has a higher threshold voltage than a transistor free from impurity dopants and the transistor remains non-conductive even when selected by a gate voltage of 5 V, for example. Accordingly, the gate regions can be made to correspond to the memory data unit of a "1" or a "0" in accordance with the presence or absence of having the impurity region of the first conductivity type.

The ROM of the present embodiment must have the following dimensions when conforming to the 1.0-$\mu$m rule. With reference to FIG. 1 (b), the required horizontal pitch is 2 $\mu$m, which is a total of 0.5 $\mu$m for a half portion h of the source region 10a, 0.5 $\mu$m for a half portion i of the drain region 10b and 1$\mu$m for the spacing (gate region) j between the source region 10a and the drain region 10b. With reference to FIG. 1 (c), the required vertical pitch for the transistor having the first gate 13 is 1.4 $\mu$m, which is a total of 1.0 $\mu$m for the width H of the first gate 13, and 0.4 $\mu$m for two half portions I for the lap of the second gate 15 over the first gate 13. The required vertical pitch for the transistor having the second gate 15 is 1.4 $\mu$m, which is a total of 1.0 $\mu$m for the width J of the second gate 15, and 0.4 $\mu$m for two half portions I for the lap of the second gate 15 over the first gate 13. Thus, the required vertical pitch is 1.4 $\mu$m regardless of the gate of the transistor. Because the contacts can be provided concentrically at the peripheral portion of the memory, the area required for the contacts does not influence the area of the memory cells.

Because the ROM of the present embodiment does not require any cell separating region formed by the LOCOS process, the transistor pitch is, for example, 2 $\mu$m horizontally and 1.4 $\mu$m vertically, which is exceedingly less than the conventional transistor pitches in the area required. More specifically, in the case of the 1.0-$\mu$m rule, the area of the cell of the invention is 2.8 $\mu$m$^2$, which is about ¼ of the conventionally needed area of 11.52 $\mu$m$^2$ as already mentioned.

Accordingly, the present embodiment provides ROMs of a much higher complexity than heretofore available and are suited to be used as ROMs having 8Mbits, 16Mbits or higher complexity.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What we claim is:
1. A semiconductor memory device comprising:
   (a) a semiconductor substrate having a first conductivity type;
   (b) a plurality of semiconductor regions having a second conductivity type opposite to said first conductivity type and being formed in a first direction in a top surface layer of the substrate, said plurality of semiconductor regions being arranged in parallel strips with predetermined spacings for provid- ing alternated source and drain regions and defining gate regions between said alternated source and drain regions;

(c) a first gate insulating film formed in a plurality of strips in a second direction substantially perpendicular to said first direction on said top surface of said substrate with predetermined spacings and intersecting said plurality of semiconductor regions;

(d) a plurality of first gate electrodes disposed on each of said plurality of strips of said first gate insulating film;

(e) a second gate insulating film formed in a plurality of portions on exposed surfaces of said substrate between said plurality of strips of said first gate insulating film and over the edges of each of said first gate electrodes adjacent thereto; and (f) a plurality of second gate electrodes disposed on each of said plurality of portions of said second gate insulating film without contacting any of said first gate electrodes;

whereby a matrix of MIS semiconductor cells is formed, each of said cells being defined by the intersection of one of said gate regions with one of said first and second electrodes, and a predetermined number of gate regions of said cells being selectivity doped with an impurity substance having said first conductivity type at a higher concentration than the impurity concentration of said substrate.

2. A device as defined in claim 1, wherein said semiconductor regions under non-selected gate electrodes adjacent to selected gate electrodes function as a cell separating region for electrically isolating two adjacent cells in said matrix.

3. A device as defined in claim 1, wherein the concentration of said impurity substance having said first conductivity type is between $10^2$ and $10^5$ times greater than the concentration of said substrate.

4. A device as defined in claim 1, wherein said first conductivity type comprises an n-type and said second conductivity type comprises a p-type.

5. A device as defined in claim 1, wherein said first conductivity type comprises a p-type and said second conductivity type comprises an n-type.

6. A device as defined in claim 1, wherein said first gate insulating film comprises a thickness between 100Å and 1000Å.

7. A device as defined in claim 1, wherein said second gate insulating film comprises a thickness between 100Å and 1000Å.

8. A device as defined in claim 1, wherein said first gate insulating film comprises $SiO_2$ or $Si_3N_4$.

9. A device as defined in claim 1, wherein said second gate insulating film comprises $SiO_2$ or $Si_3N_4$.

10. A device as defined in claim 1, wherein said plurality of first gate electrodes comprise metal, polycrystalline or silicide.

11. A device as defined in claim 1, wherein said plurality of first gate electrodes comprises Al, W, Ti, Pt, Mo, WSi, WTi or WTiSi.

12. A device as defined in claim 1, wherein said plurality of second gate electrodes comprise metal, polycrystalline or silicide.

13. A device as defined in claim 1, wherein said plurality of second gate electrodes comprise Al, W, Ti, Pt, Mo, WSi, WTi or WTiSi.

* * * * *